United States Patent [19]

Fraser

[11] Patent Number: 4,528,698
[45] Date of Patent: Jul. 9, 1985

[54] TUNING SYSTEM FOR RF RECEIVER

[75] Inventor: Robert J. Fraser, Scarborough, Canada

[73] Assignee: Motorola, Inc., Schaumburg, Ill.

[21] Appl. No.: 564,130

[22] Filed: Dec. 22, 1983

[51] Int. Cl.$^3$ .............................................. H04B 1/26
[52] U.S. Cl. ................... 455/319; 455/197; 455/266; 455/340
[58] Field of Search ............... 455/192, 196, 197, 256, 455/258, 264, 265, 266, 313, 318, 319, 150; 334/14, 15

[56] References Cited

U.S. PATENT DOCUMENTS 3,325,737 6/1967 Berman .
3,388,331 6/1968 Rawley .
3,611,154 10/1971 Kupfer .............................. 455/197

Primary Examiner—Jin F. Ng
Attorney, Agent, or Firm—Charles L. Warren; Edward M. Roney; James W. Gillman

[57] ABSTRACT

A system is disclosed for tuning a heterodyne receiver. The system preferably includes a voltage tunable preselector filter whose output is applied to a mixer, a voltage tunable injection filter for filtering a local oscillator signal and for applying the filtered signal to the mixer, and tuning control circuitry. The tuning control circuitry senses the power output from the injection filter and develops varying tuning voltages for tuning both filters until a peak output is developed by the injection filter, whereby the filters are tuned for heterodyning an incoming RF signal to a desired IF frequency.

8 Claims, 3 Drawing Figures

TUNING SYSTEM FOR RF RECEIVER

FIELD OF THE INVENTION

This invention relates generally to RF receivers and, more particularly, to a system for tuning such receivers by using voltage tunable filters.

BACKGROUND OF THE INVENTION

Conventional radio frequency preselection techniques, for frequencies in the 0.1 to 1 Ghz range, require the use of narrowband (1 to 10 MHz) mechanically tuned filters to provide filtering of received RF signals and to provide appropriately filtered oscillator injection signals. These filters are usually combined with an active or passive mixer and an optional amplifier to complete the radio receiver front end.

Various attempts have been made to automate the tuning operation of the receiver's front end. For example, one conventional approach to automatic fine tuning employs an RF varactor tuned circuit, a frequency converter or mixer, a local oscillator, an auxiliary varactor tuned circuit, a phase discriminator and an amplifier arranged to provide the tuning control function. While this approach may provide a form of automatic fine tuning, its phase discrimination scheme is undesireably complex, prone to temperature-induced instabilities, and limited in the frequency range over which it can provide tuning.

With the advent of new semiconductor technology, it is now possible to construct a narrowband filter which may be voltage tuned over more than half an octave without any appreciable degradation to the filter's characteristic. The use of these voltage tunable filters as injection and RF preselection filters, combined with an improved tuning control system, can significantly enhance the performance of existing receiver front ends.

SUMMARY OF THE INVENTION

It is an object of the present invention to provide an improved tuning system for the front end of a radio receiver.

It is another object of the present invention to provide a heterodyne radio receiver with a tuning system that is capable of automatically tuning the receiver over a wide frequency range.

It is yet another objective of the present invention to provide a tuning system that incorporates narrowband voltage tuned filters in a manner that significantly enhances the performance of a radio receiver.

The foregoing and other objectives of the present invention are attained, in accordance with the present invention, with a tuning system that includes a frequency converter or mixer and a voltage tunable filter for preselecting an incoming RF signal and applying that filtered signal to the mixer to be heterodyned by a filtered local oscillator signal. A voltage tunable injection filter filters the output of the local oscillator and applies the filtered output to the mixer to heterodyne the incoming radio frequency signal into an intermediate frequency signal. A tuning control means responds to the power output of the injection filter for adjusting both the injection filter and the preselector filter to appropriate frequencies for optimum heterodyning of the radio frequency signal into the intermediate frequency.

DETAILED DESCRIPTION OF THE PREFERRED EMBODIMENT

Figure 1:
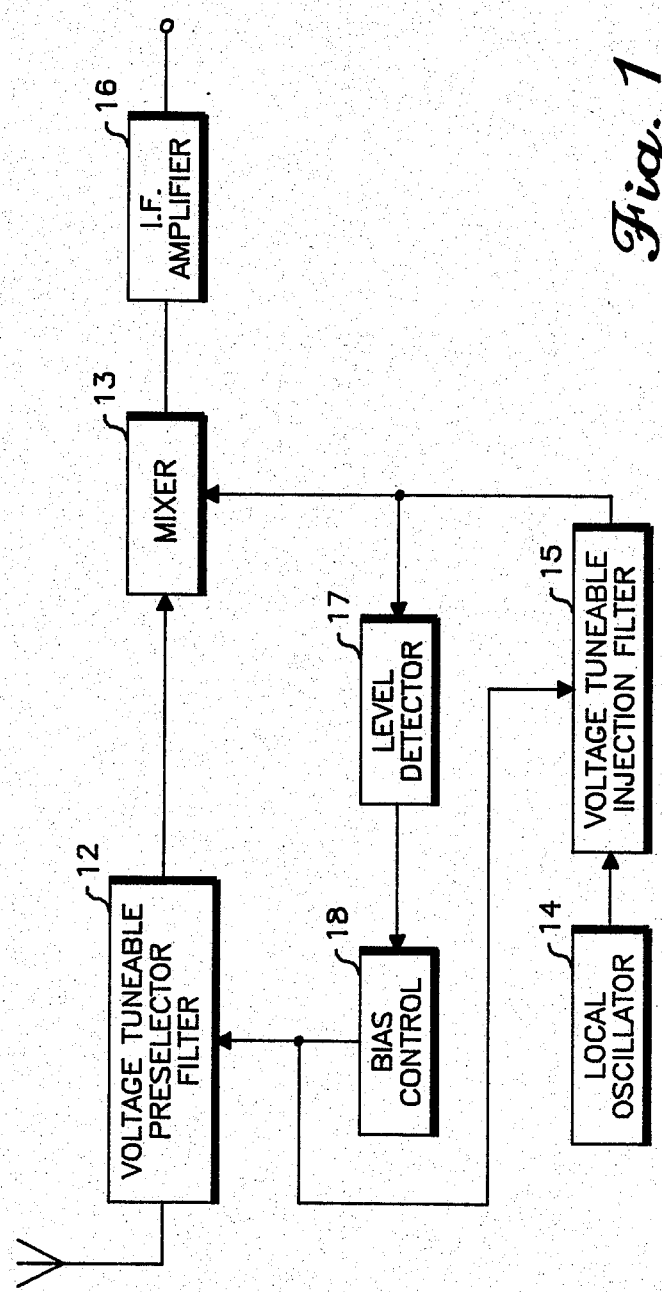
FIG. 1 is a block diagram of the tuning control system according to the present invention.

FIG. 1 shows, in a functional block diagram form, a tuning system that may be employed in the front end of a heterodyne radio receiver according to the present invention. The system consists of two major parts. The first part includes a voltage tunable preselector filter 12 and a voltage tunable injection filter 15. Both these filters are varactor tuned bandpass filters whose resonant or center frequencies may be adjusted by changing a bias voltage presented to the varactor. The preselector filter 12 and the injection filter 15 may be voltage tuned across their respective tuning ranges. U.S. patent application Ser. No. 450,935, filed Dec. 20, 1982 and assigned to the assignee of the present invention, discloses a preferred construction for such voltage tunable filters.

The second part of the system detects the injection filter power output and locks both the injection filter and the preselector filter at the appropriate frequencies for optimum heterodyning of the radio frequency signal by the mixer into an intermediate frequency (IF) signal. This is accomplished by a level detector 17 which detects the power output of the injection filter 15, and a bias control 18 which monitors the output of the level detector 17 and applies a correct DC bias to the preselector filter 12 and to the injection filter 15. The level of the bias applied to the filters is under control of the level detector 17 as discussed in more detail below.

For correct system operation (when using a common bias voltage for both filters), the preselector filter and the injection filter are preferably selected to meet the following specifications. At any working bias level, the resonant frequencies of the preselector and injection filters differ by a constant frequency across their entire tuning range. That constant frequency difference is equivalent to the center frequency of the intermediate frequency amplifier 16. The tuning range of the injection filter is equivalent in absolute frequency to the desired local oscillator range and the preselect filter tuning range is the same, but adjusted either plus or minus to the frequency difference which corresponds to the intermediate frequency. Preferably, the passband of the injection filter is equal to, or narrower than the preselector filter passband, and the response contains substantially no passband ripple.

Figure 2:
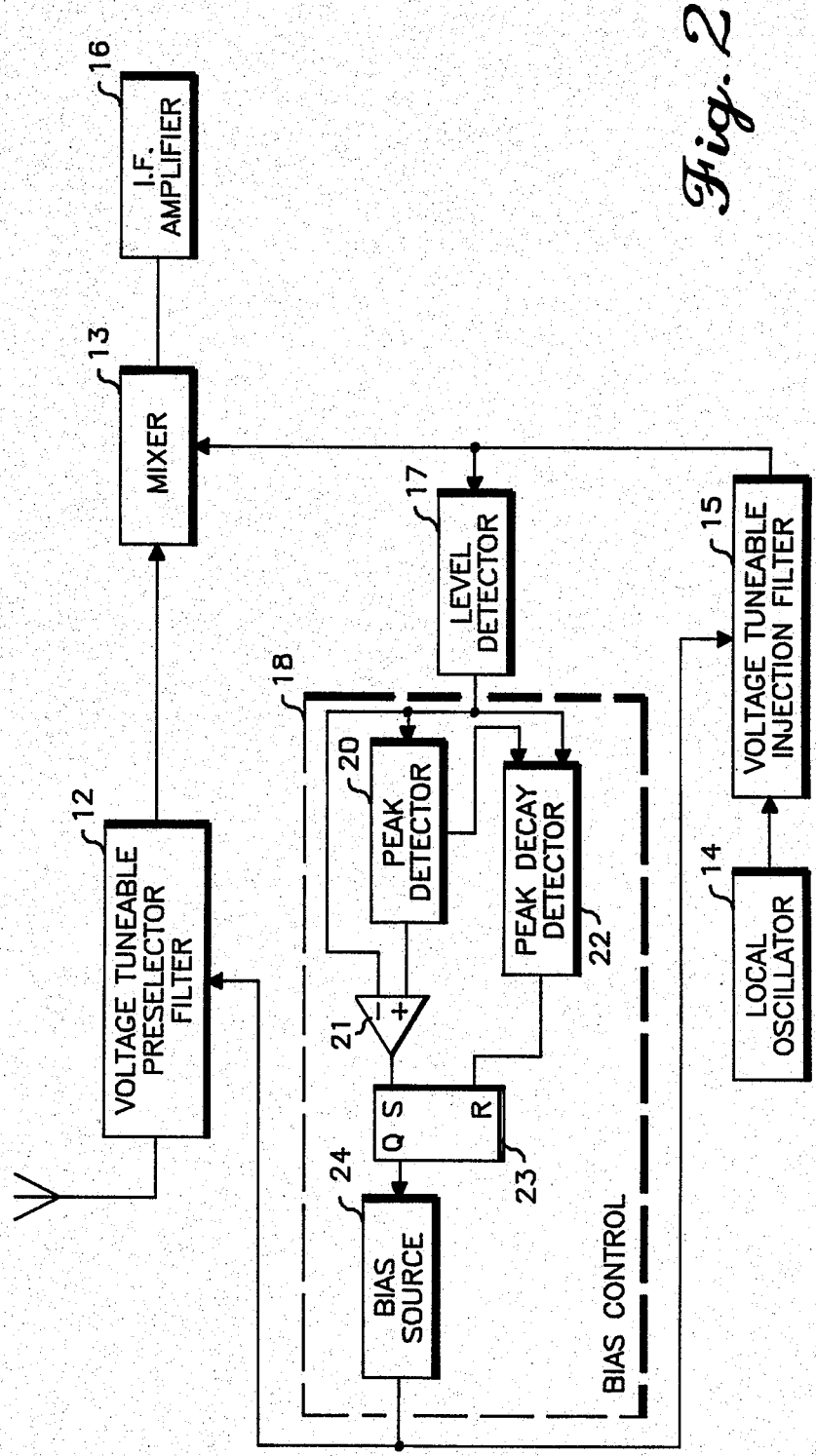
FIG. 2 illustrates an illustrative embodiment of the bias control which is shown more generally in FIG. 1.

The bias control described broadly hereinabove may be implemented in a number of ways. One such approach is illustrated in FIG. 2. Referring to FIG. 2, the level detector 17 is of conventional design (a crystal detector, for example) which detects the RF power output of the injection filter 15 and converts the detected RF power level to a proportionate DC voltage. The bias control 18 includes a conventional peak detector 20 which detects and holds the peak of the power output of the injection filter as detected by the level detector 17. The output of the peak detector 20 is coupled to the positive input of a voltage comparator 21, the negative input of which is coupled to the output of the level detector 17. As described more fully below, the comparator 21 and the peak detector 20 cooperate to determine when the output from the level detector 17 is at a maximum.

Also included in the bias control 18 is a peak decay detector 22 which continually monitors the output of the level detector 17 and compares this value with the value held by the peak detector. This latter function may be accomplished by using a conventional comparator.

The bias control is further provided with a logic circuit which may be in the form of a flip-flop circuit 23 that is set by the comparator 21 and reset by the output of the peak decay detector 22. The bias source 24, which is under control of the output of the flip-flop, operates either in an active or passive state.

In the active state, when the flip-flop is reset, the bias source operates as an oscillator of a type which, in this example, provides a free-running triangular wave output to the injection and preselection filters. In the passive state, when the flip-flop is set, the bias source halts its oscillatory action and holds its output constant at the last attained level. At that level, the filters should be optimally tuned and the level detector 17 should sense a maximum power output from the injection filter 15.

To heterodyne a particular radio frequency signal to an intermediate frequency, a local oscillator signal of desired level and frequency is presented to the input of the injection filter 15. The bias control 18 is in an active state and allows the bias source 24 to tune the injection filter 15 across a predetermined band which contains the local oscillator signal frequency.

During the tuning process, the level detector 17 detects the changing power level at the output of the injection filter. As that power level increases, the output of the level detector 17 undergoes a corresponding increase which is sensed by the peak detector 20 and the comparator 21. As the point of peak power output from the filter 15 is passed, the input to the peak detector 20 decreases. Because the peak detector cannot follow that decrease, its output remains at a value which corresponds to the maximum output from the level detector 17. Consequently, the positive input of the comparator 21 now receives a larger voltage than its negative input, thus causing its output to go high and set the flip-flop 23. This causes the bias source 24 to go to its passive state and to hold its output voltage at the last attained level. A lock condition is thus established in which the injection filter 15 and the preselect filter 12 are at the appropriate resonant frequencies for the radio frequency signal to be heterodyned by the mixer to develop the proper intermediate frequency.

After the system has locked, the peak decay detector 22 continually monitors the output power of the injection filter. If the output power degrades due to the changes in uncontrollable parameters such as temperature instabilities, circuit leakages, filter drifts, or in controllable parameters such as a change in the local oscillator level or frequency, then the peak decay detector 22 will sense this power degradation, with reference to the peak power level held by the peak detector 20, and reset the bias source 24. The system will again lock, once the optimum injection filter level has been detected.

Figure 3:
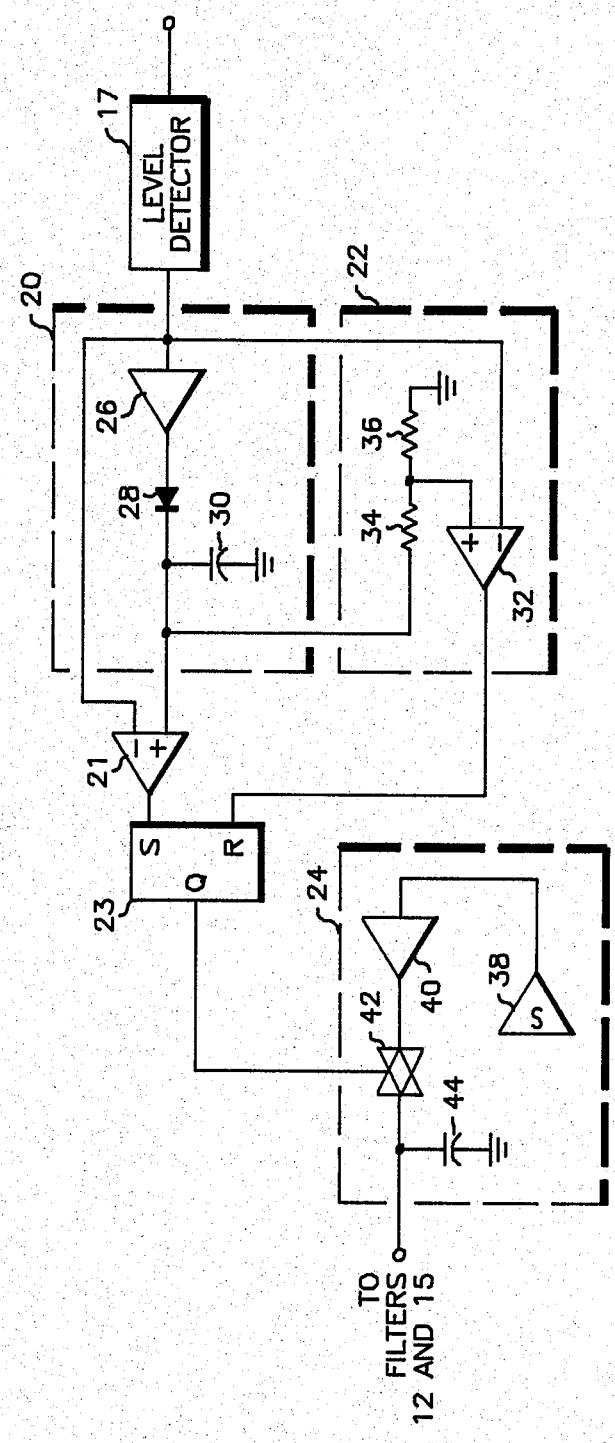
FIG. 3 is a circuit diagram showing further detail of the bias control which is shown in FIG. 2.

The peak detector 20, the peak decay detector 22 and the bias source 24 may each be of conventional contruction. FIG. 3, to which reference is now made, illustrates exemplary designs for these items.

As shown, the peak detector 20 may include a buffer amplifier 26 receiving the output of the level detector 17. The output of the buffer 26 is peak detected by a diode 28 and a capacitor 30 in the usual manner.

The peak decay detector 22 includes a voltage comparator 32 whose negative input receives the output of the level detector 17. The positive input to the comparator 32 is received from the junction between resistors 34 and 36. These resistors are serially coupled between ground and the output of the peak detector. Their function is to establish a reset level (determined by the ratio of resistor 34 to resistor 36) indicative of a point at which it is desirable for the flip-flop 23 to be reset so that the filters can be retuned to account for circuit leakages, temperature changes and the like.

The bias source 24 may include a conventional oscillator 38 which runs continuously. Its output is coupled to a buffer 40 which drives a sample and hold circuit comprising a switch 42 and a capacitor 44. Closure of the switch 42 is controlled by the Q output of the flip-flop 23.

In operation, resetting the flip-flop 23 causes its Q output to be false so as to close the switch 42. This allows to signal from the oscillator 38 to pass through the switch 42 for application to the filters 10 and 15. Conversely, setting the flip-flop 23 causes the switch 42 to open the path between oscillator 38 and the filters. In that situation, the capacitor 44 holds the last value of the oscillator signal for application of that value to the filters 12 and 15.

The foregoing discussion has described one method by which the filters may be tuned according to the invention. Yet another method by which the filters may be tuned according to the present invention is to make use of a bias control circuit which continually monitors the level detector 17 output and, by means of continual feedback adjustment of the bias voltage, attempts to maximize at all times the power level at the output of the injection filter. This "dynamic" approach would be continually active and would yield no passive or locked state.

With the use of the tuning system in accordance with the present invention as described hereinabove, the following advantages are provided.

First, degradation from optimum receiver performance due to filter drifts caused by temperature instabilities is eliminated. This is made possible because the preselect filter and the injection filter are controlled by the bias control 18 such that the filter drifts due to temperature instabilities are common to both filters. Thus, for a particular receive frequency, the bias voltage applied to the filters in a locked condition would not only be a function of injection frequency, but the bias voltage will also be a function of temperature to provide automatic self adjustment.

Yet another advantage of the present tuning system is that it provides stand-alone automatic tuning operation with no external control over a wide range of RF frequencies. This feature provides a standard high specification front end that is compatible with most IF receivers and local oscillator sources.

Still another advantage of the present system is that it utilizes an injection filter in a dual function. First, as a frequency sensitive device, the filter's output is used by the control system to determine the correct receiver tuning. Second, as a conventional narrowband injection filter, it eliminates local oscillator spectral impurities such as harmonic distortions, and more significantly, eliminates mixer wideband noise desensitization and mixer matching problems which are associated with conventional broadband designs.

Still another advantage of the present system is that, due to the high speed with which varactor tuned filters may be aligned and the simplicity of this system, the front end tuning time can be several orders of magnitude faster than the lock time for standard RF frequency synthesizers. The combination of RF frequency synthesis and receiver front-end self tuning go hand in hand to make it possible to provide a mid-to-high specification receiver which can perform complicated tasks such as frequency hopping or wide-space frequency scanning, and may be purchased "off the shelf" and programmed to operate on any customer frequency without factory or field tuning of the receiver's front end.

Although the invention has been described in terms of an exemplary embodiment, it will be obvious to those skilled in the art that many alterations and modifications may be made without departing from the invention. Accordingly, it is intended that all such alterations and modifications be included within the spirit and scope of the invention as defined by the appended claims.

I claim:

1. In a heterodyne receiver, a tuning system comprising:
    a mixer;
    a tunable preselector filter for filtering an incoming RF signal and applying the filtered signal to said mixer to be heterodyned;
    a local oscillator;
    a tunable injection filter for filtering the output of said local oscillator and applying the filtered output to said mixer to heterodyne the filtered incoming RF signal into an intermediate frequency signal; and
    tuning control means responsive to the power output of said injection filter for adjusting both said injection filter and said preselector filter to appropriate frequencies for heterodyning of the radio frequency signal into the intermediate frequency.

2. A tuning system as set forth in claim 1 wherein said tuning control means varies the tuning of said filters until it detects a maximum output from the preselector filter.

3. A tuning system as set forth in claim 1 wherein said filters are tunable in response to applied bias voltages and wherein said tuning control means includes:

a level detector for sensing the output power of the injection filter and for developing an output signal corresponding to the sensed power level;
    means including a peak detector for sensing a peak output from said level detector and for storing a peak signal representative of the peak output;
    a bias source coupled to each filter for applying varying bias voltages to said filters so as to vary their tuning, and responsive to a sensed peak output of the level detector for holding the bias voltages substantially constant; and
    means for comparing the stored peak signal to the output from the level detector for enabling the bias source to again apply varying bias voltages to the filters in response to the output from the level detector dropping a predetermined level below the value of the stored peak signal.

4. The system according to claim 1, wherein said tuning control means includes:
    a detector for detecting the output power of said tunable injection filter; and
    bias control means responsive to the output of said detector for applying a controlled level of bias to said preselector filter and to said injection filter so that the resonant frequencies of said preselector and injection filters differ by a constant frequency across the entire tuning range of said filters.

5. The system according to claim 4 wherein said injection filter has a tuning range equivalent to the desired range of said local oscillator.

6. The system according to claim 4 wherein the bandwidth of said injection filter is selected to be equal to or less than the bandwidth of said preselector filter.

7. The system according to claim 4 wherein said bias control means is adapted to apply a variable bias to the injection filter for tuning the injection filter across a predetermined frequency range which includes the frequency of the local oscillator, wherein said bias control means responds to the maximum power output of the injection filter by holding its bias output constant and at a level wherein the incoming RF signal is heterodyned by the mixer into the intermediate frequency, and wherein said bias control means responds to a degradation in the power output from the injection filter for altering the bias applied to said filters until a maximum power output is again detected.

8. The system according to claim 4 wherein said detector develops an output indicative of the power output from said injection filter, and wherein said bias control means continuously monitors the detector's output for continuously adjusting the level of bias applied to both filters in a feedback mode so as to continuously maximize the power output of the injection filter.

* * * * *